United States Patent
Lyu

[19]

[11] Patent Number: 6,108,528
[45] Date of Patent: Aug. 22, 2000

[54] RECEIVE SQUELCH CIRCUIT HAVING FUNCTION OF DETECTING PULSE WIDTH

[75] Inventor: Hyung Lyul Lyu, Seoul, Rep. of Korea

[73] Assignee: LG Semicon Co., Ltd., Cheongju, Rep. of Korea

[21] Appl. No.: 08/958,929

[22] Filed: Oct. 28, 1997

[30] Foreign Application Priority Data

Nov. 4, 1996 [KR] Rep. of Korea ................. 96/51755

[51] Int. Cl.[7] ............................................. H04B 1/16
[52] U.S. Cl. .................... 455/212; 455/220; 455/222; 327/31
[58] Field of Search .................................. 455/212, 220, 455/218, 219, 222, 200.1, 223, 296; 327/34, 31; 375/351

[56] References Cited

U.S. PATENT DOCUMENTS

| | | | |
|---|---|---|---|
| 3,603,884 | 9/1971 | Zaura, Jr. et al. | 455/212 |
| 4,085,370 | 4/1978 | Van Der Poel et al. | 455/212 |
| 4,172,996 | 10/1979 | Tokunaga et al. | 455/218 |
| 4,203,072 | 5/1980 | Beningfield et al. | 455/223 |
| 4,724,545 | 2/1988 | Hamada | 455/212 |
| 5,003,556 | 3/1991 | Curtis et al. | 455/218 |
| 5,285,481 | 2/1994 | Van Tran | 327/31 |
| 5,327,465 | 7/1994 | Wincn et al. | 455/218 |
| 5,408,694 | 4/1995 | Tran | 455/212 |
| 5,418,821 | 5/1995 | Tran | 327/31 |

*Primary Examiner*—Nguyen Vo
*Assistant Examiner*—Eliseo Ramos-Feliciano
*Attorney, Agent, or Firm*—Fleshner & Kim, LLP

[57] ABSTRACT

A receive squelch circuit detects a pulse width of an input data signal to prevent errors from occurring during detection of received data. The squelch circuit adds a function of detecting a pulse width to an input side to detect normal and abnormal pulse signals of received data and adjust the squelch circuit operations. The squelch circuit includes a plurality of current sources for each supplying a predetermined amount of current in accordance with a supplied power and a plurality of MOS transistors for detecting a pulse width of an input differential data signal. A plurality of voltage comparators compares the detected pulse width of the input differential data signal with a standard value and judges whether the detected pulse width is normal.

13 Claims, 4 Drawing Sheets

RECEIVE SQUELCH CIRCUIT HAVING FUNCTION OF DETECTING PULSE WIDTH

BACKGROUND OF THE INVENTION

1. Field of the Invention

The present invention relates to a squelch circuit, and in particular, to a squelch circuit that eliminates noise when there is no input to a receiver.

2. Background of the Related Art

As shown in FIG. 1, the related art squelch circuit 10 includes a programmable control network 20 and first and second N channel transistors 12,14 operated in accordance with differential input signals (V+,V−) that are connected in parallel with each other. First and second load resistances (R1,R2) are respectively connected to the sources of the first and second N channel transistors 12,14. A current source 16 is connected in parallel with the first and second N channel transistors 12,14.

The related art squelch circuit 10 further includes an N channel transistor 18 connected to the current source 16 and having a gate and a drain commonly connected, a first source resistance ($R_{s3}$) connected between the source of the N channel transistor 18 and ground. A first comparator 30 has an inverting input terminal (−) connected to an input node of the second load resistance (R2) and a non-inverting input terminal (+) connected to an output node of the first load resistance (R1). A second comparator 32 has an inverting terminal (−) connected to the input node of the first load resistance (R1) and a non-inverting terminal (+) connected to the output node of the first load resistance (R2).

In the programmable control network 20, a first N channel source transistor 22 is connected in series with a second source resistance ($R_{s1}$) between ground and an output node of the first load resistance (R1). A first N channel control transistor 24 is connected in series with a first variable resistance ($R_{V1}$) between ground and the first load resistance (R1). A second N channel source transistor 26 is connected in series with a third source resistance ($R_{S2}$) between ground and an output node of the second load resistance (R2). A second N channel control transistor 28 is connected in series with a second variable resistance ($R_{V2}$) between ground and the second load resistance (R2).

The first through third source resistances ($R_{S3},R_{S1},R_{S2}$) are matched and the first and second variable resistances ($R_{V1},R_{V2}$) are controlled in accordance with an input control voltage signal ($V_{CONTROL}$). Further, the gates of first and second N channel source transistors 22,26 and the first and second N channel control transistors 24,28 are commonly connected to the gate of the N channel transistor 18.

The operation of the related art receive squelch circuit will now be described. When differential input signals (V+,V−) employed in a twisted pair (TP) cable communication channel are inputted to respective gates of the N channel input transistors 12,14, the N channel input transistors 12,14 are operated. Accordingly, a current (I) starts to flow in the current source 16.

When the current (I) starts to flow in the current source 16, the N channel transistor 18 is turned on and maintained because the drain and gate of the N channel transistor 18 are commonly connected. Therefore, the current (I) flows through the N channel transistor 18. The gates of the matched N channel source transistors 22,26 and the N channel control transistors 24,28 are commonly connected to the gate of the N channel transistor 18 to form a current mirror. Since the first through the third source resistances ($R_{S3},R_{S5},R_{S2}$) are matched, the current (I) flows only through the N channel transistor 18 and the N channel source transistors 22,26.

However, the currents (I) flowing through the N channel control transistors 24,28 are controlled in accordance with the values of the variable resistances ($R_{V1},R_{V2}$). The variable resistances ($R_{V1},R_{V2}$) are set in accordance with the input control voltage signal ($V_{CONTROL}$). Accordingly, across the first and second load resistances (R1,R2) appears a voltage (V) dropped by as much as a threshold voltage ($V_{TH}$) of the N channel input transistors 12,14. The voltage (V) can be expressed by the following equation.

$$V=(I+kI)R2(0<k<1) \quad (1)$$

Thus, the threshold voltages are varied in accordance with the input control voltage signal ($V_{CONTROL}$).

The first comparator 30 receives the voltage appearing at the input node of the second load resistance (R2) through its inverting input terminal (−) and the voltage appearing at the output node of the first load resistance (R1) through its non-inverting input terminal (+) and compares each voltage. Thereby, the first comparator 30 outputs a positive threshold voltage ($V_{THP}$).

To obtain a high level output value from the first comparator 30, the voltage inputted through its inverting input terminal (−) must be higher than the voltage inputted through its non-inverting input terminal (+) by as much as the positive threshold voltage ($V_{THP}$) outputted from the first comparator 30. To obtain a high level output value from the second comparator 32, the voltage inputted through its inverting input terminal (−) must be higher than the voltage inputted through its non-inverting input terminal (+) by as much as the negative threshold voltage ($V_{THN}$).

As shown in FIG. 2, to set the values of the threshold voltages ($V_{THN},V_{THP}$) in the squelch circuit 10, the programmable control network 20 of FIG. 1 can be replaced by a circuit having MOS transistors 52,54,56,58 connected in parallel with control transistors 52',54',56',58'. The control transistors 52', 54' 56' and 58' are turned on or off in accordance with gate driving signals ($V_{CONTROL1}$–$V_{CONTROL4}$). The NOS transistors 52, 54, 56, 58 are connected in series to a current mirror transistor 50 and connected in parallel to a current mirror transistor 50'. That is, the control transistors 52',54',56',58' are turned on or off in accordance with the gate driving signals ($V_{CONTROL1}$–$V_{CONTROL4}$), which are multi-bit digital inputs.

The operation of the control transistors 52', 54', 56', and 58' will now be described. For example, when the gate driving signals ($V_{CONTROL1}$,$V_{CONTROL3}$) are high and the gate driving signals ($V_{CONTROL2}$,$V_{CONTROL4}$) are low, the control transistors 52',56' are turned on and the control transistors 54',58' are turned off. The current mirror transistor 50 has its drain connected to its gate. Since the gate of the current mirror transistor 50 is connected to the gates of the control transistors 52,54,56,58, the control transistors 52,54,56,58 are kept turned on.

The threshold voltage ($V_{TH}$) determined in accordance with the programmable control network 20 can be expressed by the following equation (2) in accordance with the current (I) determined by the current mirror transistor 50 and the current (4I) determined by the control transistors 52,52',56, 56'.

$$V_{TH}(I+4I)R1 \quad (2)$$

When the control transistors of the programmable control network 20 determines the value of a current in accordance with a multibit digital input, the determined current value further determines the value of the threshold voltage of the squelch circuit 10 in accordance with the load resistances (R1,R2). Using the threshold voltage value, noise occurring in received data below the threshold voltage is eliminated. A related squelch circuit is disclosed in U.S. Pat. No. 5,408,694 issued on Apr. 18, 1995.

However, in the related art, the squelch circuit determining the threshold voltage only detects a level, but does not perform a timing check on an inputted signal. Input signal timing can cause an error in the inputted data detection. Accordingly, if a problem occurring in a transmission system causes a data delay, an obstacle or error is generated in the related art data transmission system.

The above references are incorporated by reference herein where appropriate for appropriate teachings of additional or alternative details, features and/or technical background.

SUMMARY OF THE INVENTION

An object of the present invention is to provide a squelch circuit that obviates at least the disadvantages and problems of the related art.

Another object of the present invention to provide a receive squelch circuit that detects pulse width.

A further object of the present invention is to provide a receive squelch circuit that prevents data delay, an obstruction or an error in a transmission system by detecting a input signal pulse width.

A further object of the present invention is to provide a receive squelch circuit that detects whether or not data is inputted.

To achieve at least the above objects in whole or in parts, there is provided a receive squelch circuit according to the present invention that includes a receive squelch circuit that determines whether a first signal has a prescribed pulse width and a programmable control network that removes noise in the first signal having the prescribed pulse width.

To further achieve the above objects in whole or in parts, there is provided a receive squelch circuit according to the present invention that includes a plurality of current sources for supplying a predetermined amount of current in accordance with a supplied power amount, a plurality of MOS transistors for detecting a pulse width of input data in accordance with differential input control signals, and a plurality of comparators for a pulse detection for comparing the input data pulse width through the MOS transistors with a standard value to detect whether the received pulse signal is normal.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 3:
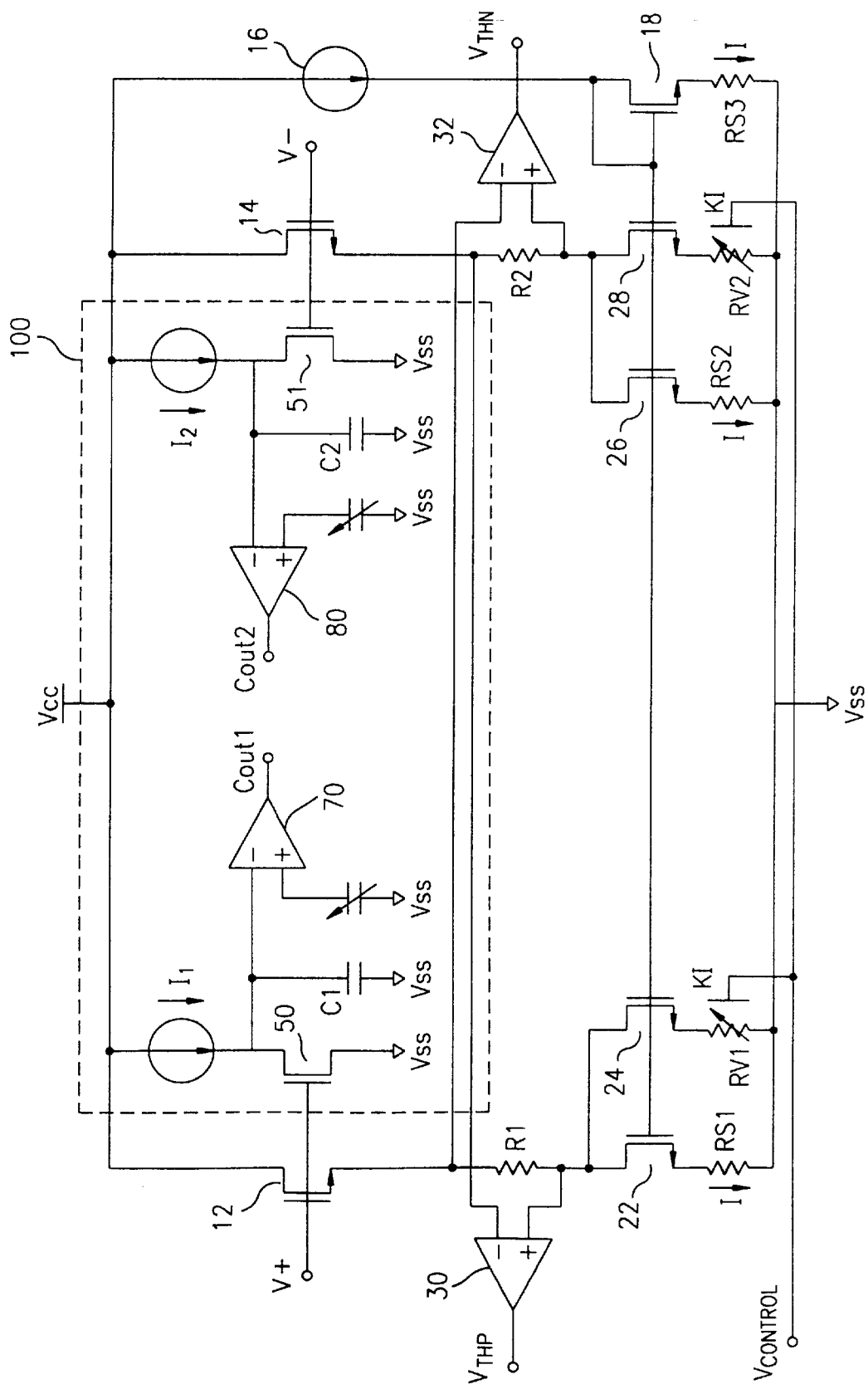
FIG. 3 is a schematic diagram showing a preferred embodiment of a receive squelch circuit according to the present invention.

As shown in FIG. 3, a preferred embodiment of a receive squelch circuit according to the present invention that detects a received signal pulse width includes current sources (I1,I2) coupled to a main power terminal (not shown). Each of the current sources (I1, I2) supplies current in accordance with a circuit power supply. The receive squelch circuit further includes input transistors 50,51 for detecting received data signals by being turned on or off in accordance with differential input signals (V+,V−) and comparators 70,80.

Figure 1:
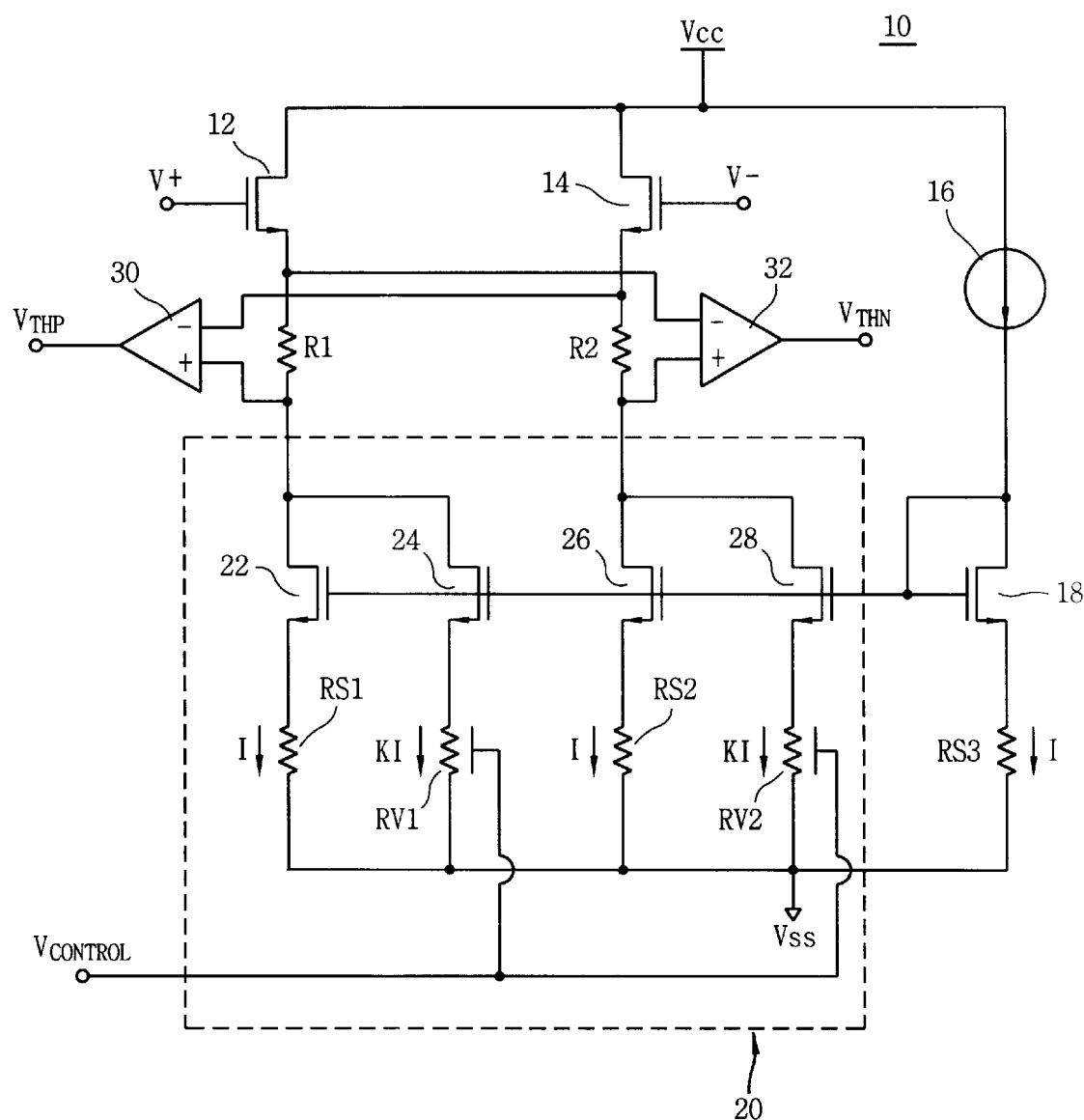
FIG. 1 is a schematic diagram showing a related art squelch circuit.
Figure 2:
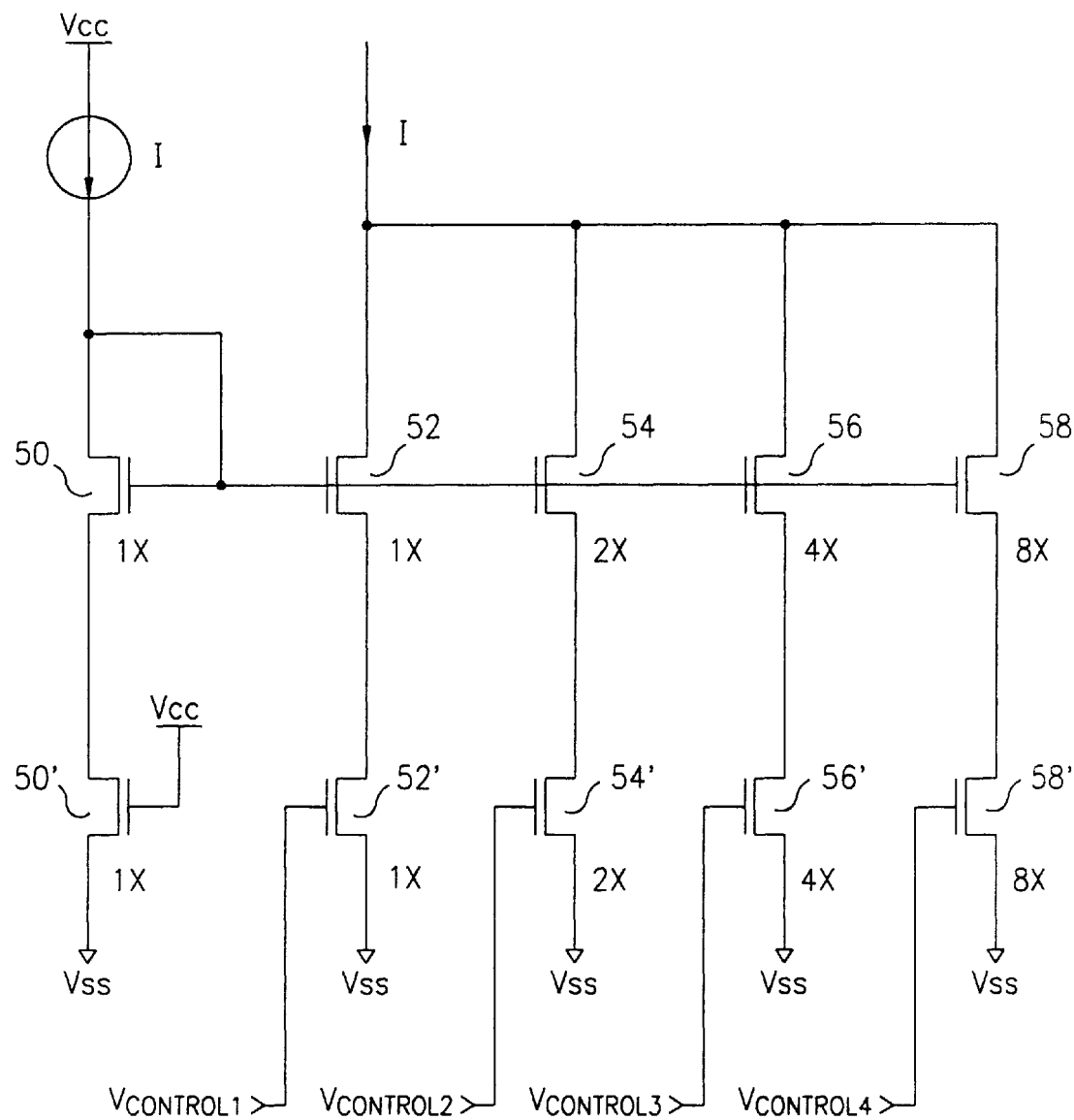
FIG. 2 is a schematic diagram showing a programmable control network of FIG. 1.

The comparators 70,80 each perform pulse width detection by detecting whether a pulse width of the signals detected by the respective input transistors 50,51 is normal. The comparators 70, 80 compare a pulse width of the data signals inputted through capacitors (C1,C2) coupled in parallel with the input transistors 50,51 with a prescribed value. Further, N channel input transistors 12,14 respectively coupled in parallel with the input transistors 50,50' receive the differential input control (V+,V−) through respective gates thereof. The remaining circuit structure is similar to the related art circuit shown in FIG. 1. Accordingly, a detailed description is omitted.

Figure 4A:
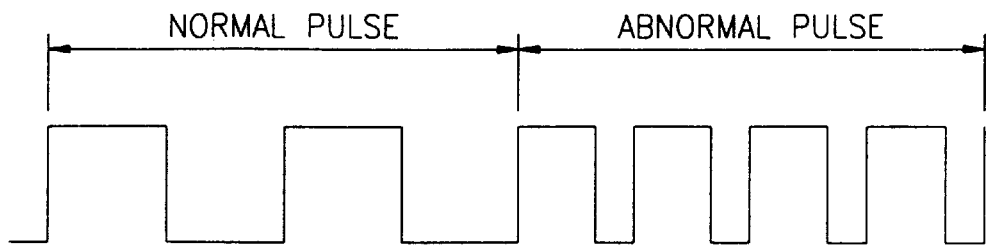
FIGS. 4A–4C are waveform diagrams showing signals of the circuit of FIG. 3.
Figure 4B:
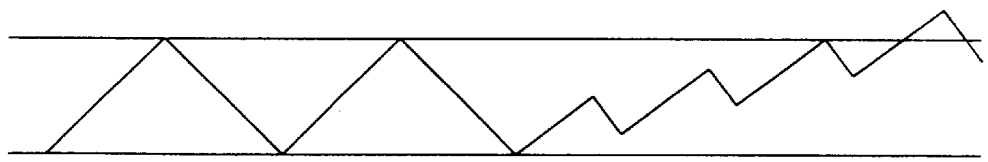

Operations of the preferred embodiment will now be described. When normal differential input signals (V+,V−) shown in FIG. 4A are respectively inputted to the gates of N channel input transistors 12,14 and input transistors 50,51 of pulse width detector 100, the input transistors 50,51 are turned on or off to generate the waveform shown in FIG. 4B in accordance with the current sources (I1,I2) and the capacitors (C1,C2). The generated waveform is inputted to the non-inverting terminals (+) of the comparators 70,80 and compared with a standard value inputted through the inverting terminals (−) thereof to output a resultant signal.

Figure 4C:

That is, when the pulse signal inputted through the non-inverting terminals (+) of the comparators 70,80 has a normal width as shown in FIG. 4A, low level signals (Cout1,Cout2) are outputted as shown in FIG. 4C. When the pulse signal inputted through the non-inverting terminals (+) has a pulse width narrower than a normal pulse width, high level signals (Cout1, Cout2) are outputted from the comparators 70,80.

When the output signals (Cout1,Cout2) from the comparators 70,80 are low and the pulse signal of the received data is in a normal state, the N channel input transistors 12,14 of the squelch circuit are operated in accordance with the differential input signals (V+,V−) as shown in FIG. 4A. Thus, current (I) starts to flow in the current source 16.

When the current (I) starts to flow in the current source 16, the N channel transistor 18 is kept turned on since the drain and the gate of the N channel transistor 18 are commonly coupled. Therefore, the current (I) starts to flow through the N channel transistor 18.

The gates of the matched N channel source transistors 22,26 and of the N channel control transistors 24,28 are commonly coupled to the gate of the N channel transistor 18 to form a current mirror. Since the first through third source resistances ($R_{S3}$,$R_{S1}$,$R_{S2}$) are matched, the current (I) flows through the N channel transistor 18 and the N channel source transistors 22,26.

However, the current flowing through the N channel control transistors 24,28 are controlled based on the values of the variable resistances ($R_{V1}, R_{V2}$) respectively set in accordance with the input control voltage signal ($V_{CONTROL}$). Thus, the currents controlled in accordance with the variable resistances ($R_{V1}, R_{V2}$) flowing through the N channel control transistors 24,28 are not identical to the current through the N channel source transistors 22,26.

The first comparator 30 compares the voltage inputted to an input node of the second load resistance (R2) received through its inverting input terminal (−) and the voltage inputted to an output node of the first load resistance (R1) received through its non-inverting input terminal (+). Then, a resultant positive threshold voltage ($V_{THP}$) is outputted. The second comparator 32 compares the voltage inputted to an input node of the first load resistance (R1) received through its inverting input terminal (−) and the voltage inputted to an output node of the second load resistance (R2) received through its non-inverting input terminal (+). Then, a resultant negative threshold voltage ($V_{THN}$) is outputted.

When the data having a pulse signal with a normal pulse width is detected through the pulse width detector 100 of the preferred embodiment of the squelch circuit, the level of the threshold voltage in the squelch circuit is determined in the programmable control network 20. Thus, whether the inputted data is normal is initially determined. Then, the threshold voltage level of the squelch circuit is determined. Thereby, an accurate determination of whether data is received and a resultant elimination of noise in the received data are performed, which improves detection of normal or abnormal data, for example, when an error occurs in a communication system such as a LAN.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art.

What is claimed is:

1. A squelch circuit comprising:
   programmable control means for adjusting a threshold voltage; and
   receive squelch circuit means for determining whether an input data signal has a prescribed pulse width, wherein the receive squelch circuit means detects a pulse width of the input data signal and compares the input data signal pulse width to a standard pulse width to determine whether the input data signal has the prescribed pulse width, wherein the receive squelch circuit means comprises,
   first and second current sources coupled to a first reference voltage each supplying a predetermined amount of current based on a supplied power,
   first and second transistors that detect a pulse width of a corresponding input data signal, wherein the first and second transistors respectively have first electrodes connected to the first and second current sources, control electrodes connected to receive the input signal, and second electrodes coupled to a second reference voltage,
   first and second capacitors respectively connected between the first electrodes of the first and second transistors and the second reference voltage, and
   first and second voltage comparators that compare one of the detected pulse widths received from the first and second transistors with a prescribed value to judge whether the detected pulse width has the prescribed pulse width.

2. The squelch circuit of claim 1, wherein the programmable control means eliminates noise below the threshold voltage from the input data signal determined to have the prescribed pulse width.

3. The squelch circuit of claim 1, wherein the receive squelch circuit means outputs a detection signal.

4. The squelch circuit of claim 3, wherein the programmable control means eliminates noise below the threshold voltage based on the detection signal.

5. The squelch circuit of claim 1, wherein the programmable control means comprises a comparator to adjust the threshold voltage.

6. The squelch circuit of claim 1, wherein the programmable control means is at least one of an analog circuit and a digital circuit.

7. A squelch circuit comprising:
   a receive squelch circuit that determines whether a first signal has a prescribed pulse width; and
   a programmable control network that removes noise in the first signal having the prescribed pulse width, wherein the receive squelch circuit means detects a pulse width of the first signal and compares the first signal pulse width to a standard pulse width to determine whether the first signal has the prescribed pulse width, wherein the receive squelch circuit means comprises,
   first and second current sources coupled to a first reference voltage each supplying a predetermined amount of current based on a supplied power,
   first and second transistors that detect a pulse width of a corresponding first signal, wherein the first and second transistors respectively have first electrodes connected to the first and second current sources, control electrodes connected to receive the first signal, and second electrodes coupled to a second reference voltage,
   first and second capacitors respectively connected between the first electrodes of the first and second transistors and the second reference voltage, and
   first and second voltage comparators that compare one of the detected pulse widths received from the first and second transistors with a prescribed value to judge whether the detected pulse width has the prescribed pulse width.

8. The squelch circuit of claim 7, wherein the programmable control network eliminates noise below a threshold voltage level from the first signal determined to have the prescribed pulse width.

9. The squelch circuit of claim 7, wherein the receive squelch circuit outputs a second signal based on whether the first signal has the prescribed pulse width.

10. The squelch circuit of claim 9, wherein the programmable control network eliminates noise below a threshold voltage based on the second signal.

11. The squelch circuit of claim 7, wherein the the programmable control network comprises at least one comparator to adjust a threshold voltage.

12. The squelch circuit of claim 7, wherein the programmable control network is at least one of an analog circuit and a digital circuit.

13. The squelch circuit of claim 7, wherein the first and second transistors are MOS transistors and the first signal is an input differential data signal.

* * * * *